(12) United States Patent
Hauenstein et al.

(10) Patent No.: US 7,573,727 B2
(45) Date of Patent: Aug. 11, 2009

(54) CONNECTING DEVICE FOR CONTACTING A SEMICONDUCTOR COMPONENT

(75) Inventors: Henning Hauenstein, El Segundo, CA (US); Dirk Balszunat, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 416 days.

(21) Appl. No.: 10/514,104

(22) PCT Filed: Jan. 10, 2003

(86) PCT No.: PCT/DE03/00052

§ 371 (c)(1),
(2), (4) Date: May 11, 2005

(87) PCT Pub. No.: WO03/096417

PCT Pub. Date: Nov. 20, 2003

(65) Prior Publication Data

US 2005/0225957 A1 Oct. 13, 2005

(30) Foreign Application Priority Data

May 11, 2002 (DE) ................................ 102 21 085

(51) Int. Cl.
*H05K 1/11* (2006.01)
*H05K 1/14* (2006.01)

(52) U.S. Cl. .................... 361/803; 361/749; 361/760; 174/254

(58) Field of Classification Search ............. 174/117 G, 174/254; 361/767, 749–750
See application file for complete search history.

(56) References Cited

U.S. PATENT DOCUMENTS

| | | | | |
|---|---|---|---|---|
| 3,818,122 A | * | 6/1974 | Luetzow | ...................... 174/86 |
| 5,010,388 A | | 4/1991 | Sakanoue et al. | |
| 5,126,820 A | | 6/1992 | Brown | |
| 5,528,456 A | | 6/1996 | Takahashi | |
| 5,914,218 A | * | 6/1999 | Smith et al. | .................. 430/320 |
| 6,646,207 B1 | * | 11/2003 | Featherstone, III | ....... 174/117 F |
| 6,743,982 B2 | * | 6/2004 | Biegelsen et al. | ............. 174/69 |

* cited by examiner

*Primary Examiner*—Tuan T Dinh
(74) *Attorney, Agent, or Firm*—Kenyon & Kenyon LLP

(57) ABSTRACT

A connecting device for contacting a semiconductor component to at least one further component, the connecting device comprising at least one metal connecting strip extending in a longitudinal direction and having a contact region for mounting on a terminal region of the semiconductor component. In order to achieve a contacting system that can be manufactured inexpensively but can nevertheless carry high current densities, a connecting device is proposed whose contact region is embodied in structured fashion and flexibly with respect to stresses that extend in a terminal plane parallel to the terminal region.

19 Claims, 3 Drawing Sheets

CONNECTING DEVICE FOR CONTACTING A SEMICONDUCTOR COMPONENT

FIELD OF THE INVENTION

The present invention relates to a connecting device for contacting a semiconductor component to at least one further component, and a method for manufacturing such a connecting device.

BACKGROUND INFORMATION

Power components with a high current capacity are necessary for modern applications. With semiconductor technologies that can switch very high power levels, high current densities and the heat resulting from power dissipation must be discharged from the chip to the environment using appropriate construction and connection technology. Conventional connecting or bonding techniques are expensive and time-consuming, and represent, in particular, a bottleneck for the current to be discharged from the chip. Good thermal contacting has hitherto been accomplished using a chip rear side soldered over a large surface area. Mounting techniques that allow good electrical and thermal contacting, for example by mounting the chip on a large surface on both sides, are used in this context.

A metal lead frame, which can be manufactured inexpensively and is produced, for example, as a stamped grid, is usable in particular as a connecting device for contacting the semiconductor component to a further component of the subassembly. The various terminal regions or contact regions of the semiconductor component can be soldered directly onto, for example, inner ends of the connecting strips of the lead frame. A particular disadvantage of using such metal lead frames, however, is the generally greater expansion of the metal as compared with the silicon of the semiconductor component, so that thermal stresses and defects can occur, as a result of the temperature ranges achievable during operation, in the metal connecting strip applied on the chip surface and/or at its interface with a contact layer made of solder or conductive adhesive.

Also known are materials with which double-sided solder joins can be made, for example direct-bonded copper (DBC) ceramics. These specially treated ceramics or thermal-clad substrates are, however, generally costly and complex in terms of manufacture.

SUMMARY OF THE INVENTION

The connecting device and method according to the present have, in contrast, the particular advantage of allowing simple and economical manufacture, while nevertheless making possible direct and relatively stress-free mounting on the chip surface.

According to a particular embodiment, a subassembly is created having at least one semiconductor component and at least one further component, the terminal regions of which are contacted via the connecting device according to the present invention.

According to the present invention, a connecting device having metal connecting strips, in particular a metal lead frame, is used to contact the terminal regions of the semiconductor component, so that complex and expensive additional materials, for example DBC ceramics, are not necessary. In order at least largely to reduce the disadvantages described above associated with the use of metal connections, in particular the mechanical stresses of large-area connections when contacting semiconductor components with high current densities and power dissipations, the contact region of the connecting device is structured, and is made flexible with respect to stresses that extend in a terminal plane parallel to the terminal region.

Such structuring can be accomplished, in particular, by configuring within the contact region a mechanical deformation reservoir that can directly intercept the mechanical stresses as a result of its flexibility. The structuring can be accomplished, in particular, by configuring undulations or corrugated regions in which a surface of the contact region facing toward the semiconductor component is enlarged with respect to the surface of the terminal region. Such undulations can be aligned in various ways in accordance with the thermal distortions that are to be expected. They can, for example, extend substantially in the longitudinal direction of the connecting strip in order to intercept lateral distortions in particular. With larger terminal regions that, in particular, also have a greater longitudinal extension, thermal stresses can moreover also be intercepted by way of one or more undulations extending transversely to the longitudinal direction of the connecting strip. It is also possible to configure deformation reservoirs by way of other geometrical form design of the structured contact region in which the side of the contact region facing the terminal region of the semiconductor component is advantageously not embodied in planar fashion. The structurings of the contact region can be embodied in the manner of corrugations, waffles, slats, and/or by configuring knobs, beads, and other depressions and elevations.

As an alternative to such structurings having a surface enlarged by way of undulations, etc. (i.e. accumulations of the material of a flat plane), it is also possible in principle to provide a reduction in material by way of suitable recesses, for example slots extending in the longitudinal or transverse direction and/or cruciform slots, which permit a flexibility with respect to stresses by way of a suitable deformation.

Attachment of the structured contact region to the terminal region of the semiconductor component can be accomplished using solder or conductive adhesive as a contact layer. The contact layer may be implemented only in partial portions between the terminal region and support regions of the structured contact region. Also possible is a large-area coating of the terminal region with the contact layer, in which context an interstice between the terminal region of the semiconductor component and the structured contact region can be left open or filled with the contact layer. This can be achieved, for example, by pressing the structured contact region onto a larger quantity of the conductive adhesive or solder.

DETAILED DESCRIPTION

Figure 1:
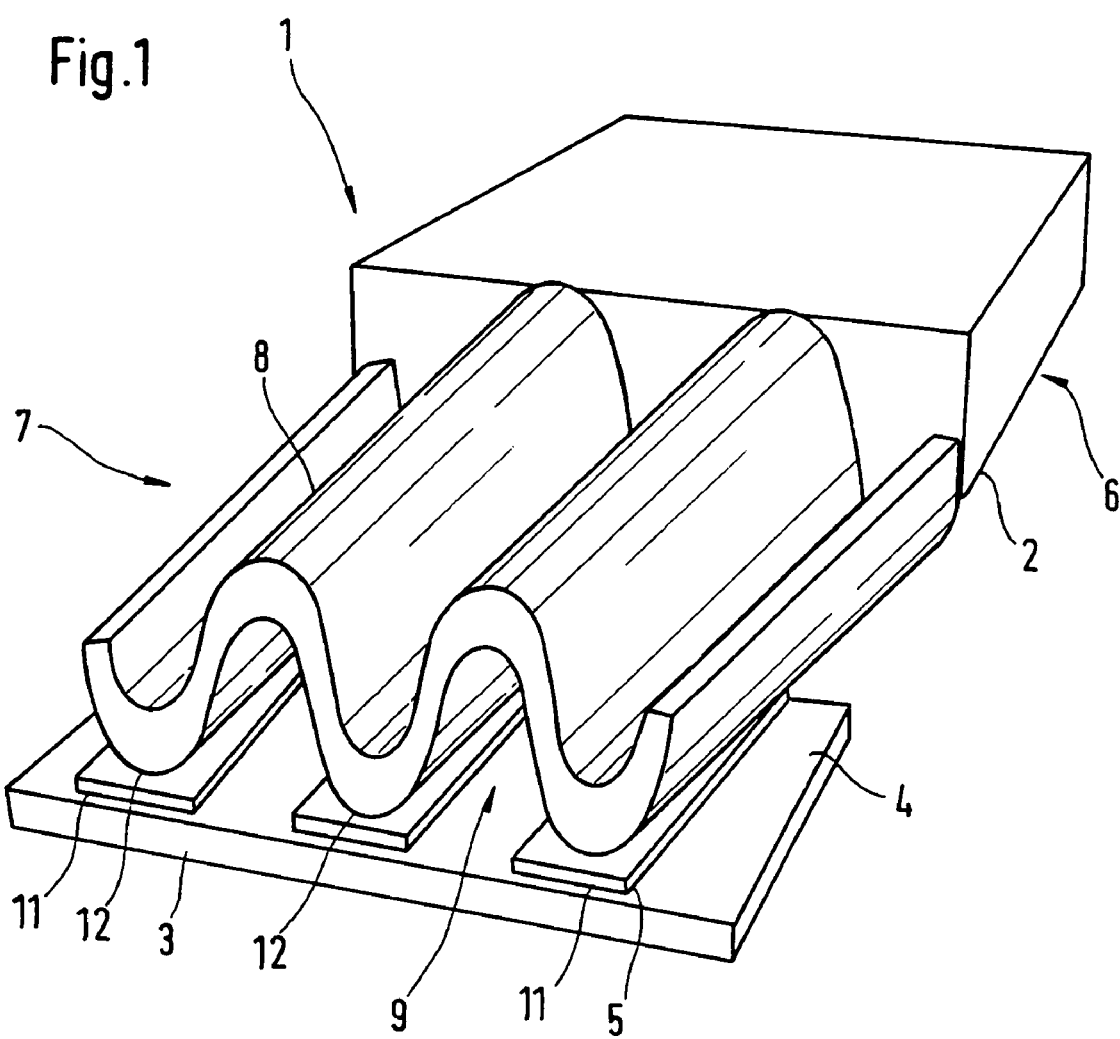
FIG. 1 is a perspective view of a subregion of a semiconductor component having a connecting device according to an embodiment of the present invention.

A subassembly 1 has, as a semiconductor component, a silicon chip 3 that is patterned in a manner not shown further, and at least one terminal region 4 configured on its upper side, as a metal layer, for contacting with external components.

Applied onto terminal region 4 is a contact layer 5, made of solder or conductive adhesive, that has multiple partial areas 11 extending in parallel fashion in the longitudinal direction. Placed on contact layer 5 is a metal connecting strip 2 that serves as a metal contact and rests in contact surfaces 12 on partial areas 11. Connecting strip 2 extends in a longitudinal direction and connects terminal region 4 to corresponding terminal regions of a further component. Metal connecting strip 2 can be part of a lead frame for contacting multiple terminal regions.

Metal connecting strip 2 has an unstructured region 6 that extends over a greater length to the other component, and a contact region 7 that is mounted on terminal region 4. Contact region 7 is structured by the fact that material is removed as compared with unstructured region 6. A structure having several undulations 8 extending in the longitudinal direction is configured in this context, forming a deformation reservoir with respect to deformations in the lateral or transverse direction. The undulation structure that is formed can have a uniform or a nonuniform thickness, for example with thicker regions along the comb regions. What is achieved thereby is thus an undulating, wavelike, or corrugated structure. Temperature changes, in particular temperature elevations as a result of the electrical current that flows through terminal region 4, contact layer 5, structured contact region 7, and unstructured region 6, result in a deformation of structured contact region 7 without detachment of contact surfaces 12 from partial areas 11. Interstices 9 between the terminal region 4 and the structured region 7 can be left open or filled with the contact layer 5.

Figure 2:
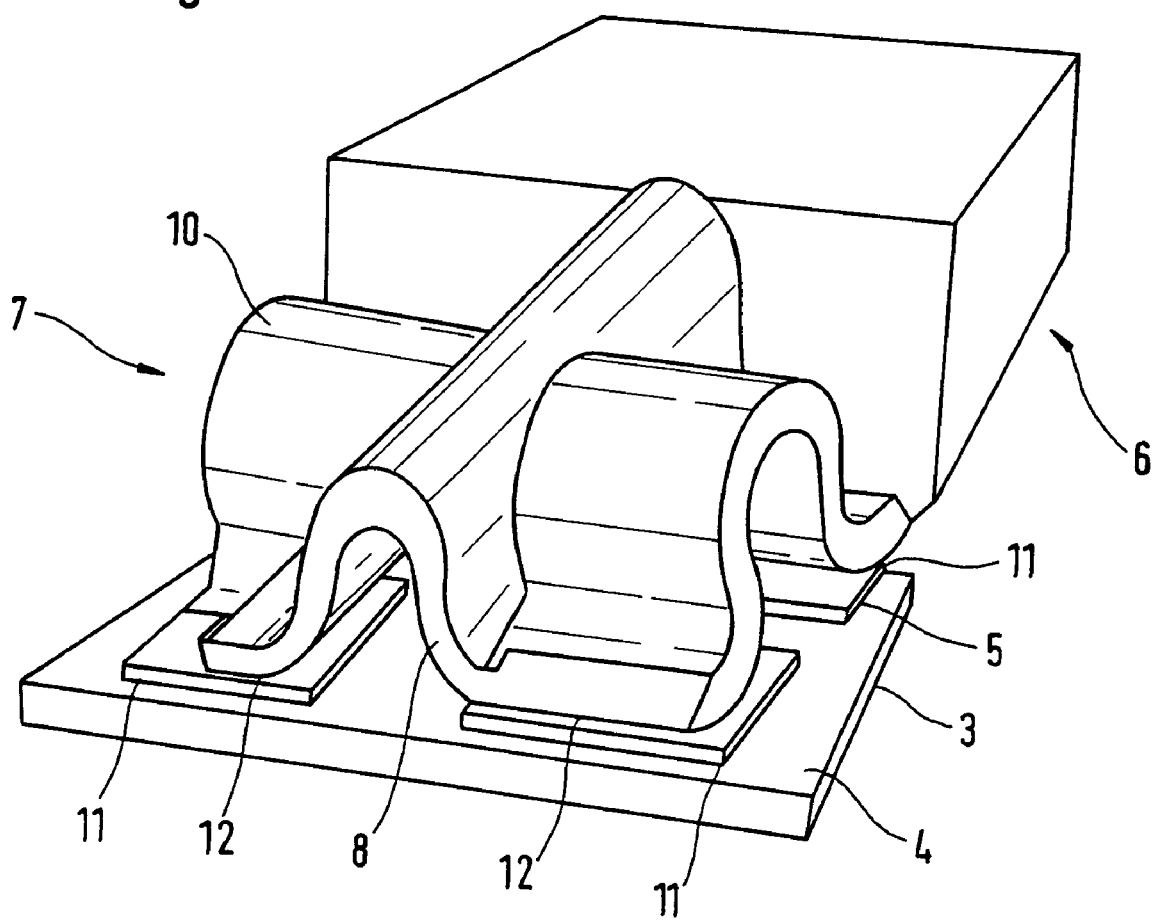
FIG. 2 is a corresponding perspective view in accordance with a further embodiment of the present invention.

In the embodiment shown in FIG. 2, an undulation 8 extending in the longitudinal direction is configured in structured contact region 7. Additionally configured are one or more undulations 10 extending in the transverse direction, which transition into undulation 8. A structure of this type can also (in particular when undulations 8, 10 are of the same height) be configured as a cruciform structure, which exhibits a deformation reservoir for distortions caused by stresses in both the longitudinal and the transverse direction and can thus intercept any stresses parallel to terminal region 4. As an alternative to the cross structure shown in FIG. 2, a complementary structure that has a depression in central portions of structured contact region 7 can also be configured.

Figure 3:
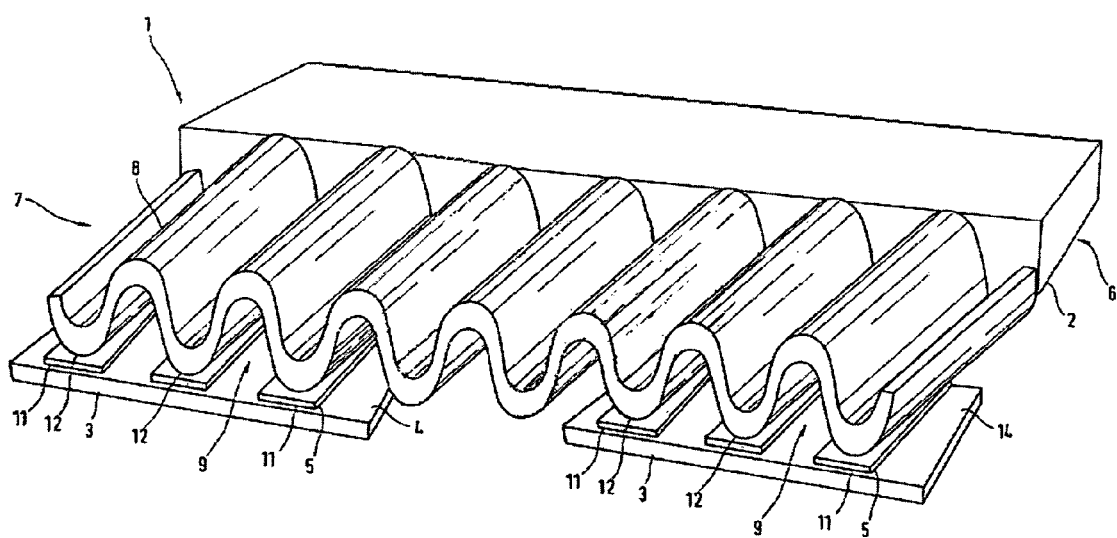
FIG. 3 is a corresponding perspective view in accordance with a further embodiment.

In the embodiment shown in FIG. 3, connecting strip 2 extends in a longitudinal direction and connects terminal region 4 to corresponding terminal region 14 of a further component.

For manufacture of the various embodiments, a lead frame can first be manufactured in a manner known per se using a stamping, pressing, cold extrusion method, its contact regions 7 subsequently being structured using a suitable material processing method. A laser cutting method or etching method, for example, can be used for this.

What is claimed is:

1. A connecting device for contacting a semiconductor component to at least one further semiconductor component, the connecting device comprising:
   at least one metal connecting strip extending in a longitudinal direction and including a contact region for mounting on a terminal region of the semiconductor component;
   wherein the contact region is structured and flexible with respect to stresses that extend in a terminal plane parallel to the terninal region;
   wherein the structured contact region includes a deformation reservoir for deformations in the terminal plane;
   wherein at least one portion of the structured contact region is mounted on at least one terminal region of the at least one further semiconductor component; and
   wherein each portion of the structured contact region that is mounted on the terminal region is structured and flexible with respect to stresses that extend in terminal plane parallel to the terminal region and includes a deformation reservoir for deformations in the terminal plane.

2. The connecting device of claim 1, wherein the structured contact region has an enlarged surface area as compared with the terminal region of the semiconductor component.

3. The connecting device of claim 1, wherein a plurality of metal connecting strips are provided for contacting the terminal region of the semiconductor component.

4. The connecting device of claim 1, wherein the device is configured as at least one of a stamped and pressed grid.

5. The connecting device of claim 1, wherein the structured contact region is structured using material processing methods.

6. The connecting device of claim 1, wherein the structured contact region has an enlarged surface area as compared with the terminal region of the semiconductor component, and wherein a plurality of metal connecting strips are provided for contacting the terminal region of the semiconductor component.

7. The connecting device of claim 2, wherein the structured region has at least one undulating region.

8. The connecting device of claim 5, wherein the contact region is structured using at least one of an etching method and a laser cutting method.

9. The connecting device of claim 6, wherein the structured region has a plurality of parallel undulating regions that extend transversely in the longitudinal direction.

10. The connecting device of claim 7, wherein the structured region has a plurality of parallel undulating regions that extend in the longitudinal direction.

11. The connecting device of claim 7, wherein the at least one undulating region is formed extending transversely to the longitudinal direction.

12. The connecting device of claim 9, wherein the device is configured as at least one of a stamped and pressed grid.

13. A subassembly comprising:
   a semiconductor component including at least one terminal region;
   at least one further semiconductor component including at least terminal region; and
   a connecting device connecting the terminal regions of the semiconductor component and the at least one further component, the connecting device including at least one metal connecting strip extending in a longitudinal direction and including a contact region for mounting on the at least one terminal region of the semiconductor component;
   wherein the contact region is structured and flexible with respect to stresses that extend in a terminal plane parallel to the at least one terminal region of the semiconductor component;
   wherein the structured contact region includes a deformation reservoir for deformations in the terminal plane;
   wherein at least one portion of the structured contact region is mounted on at least one terminal region of the at least one further semiconductor component; and
   wherein each portion of the structured contact region that is mounted on the terminal region is structured and flexible with respect to stresses that extend in the terminal plane parallel to the terminal region and includes a deformation reservoir for deformations in the terminal plane.

14. The subassembly component of claim 13, further comprising:
- a structured contact layer situated between the at least one terminal region of the semiconductor component and the contact region.

15. The subassembly of claim 13, wherein the structured contact layer is applied continuously on the at least one terminal region of the semiconductor component.

16. The subassembly component of claim 13, further comprising:
- a structured contact layer situated between the at least one terminal region of the semiconductor component and the contact region;
- wherein the structured contact layer is one of a solder and a conductive adhesive, and is applied on the at least one terminal region of the semiconductor component in parallel partial areas beneath contact surfaces of the structured contact region, wherein the structured contact layer is applied continuously on the at least one terminal region of the semiconductor component, and wherein interstices between the at least one terminal region of the semiconductor device and the structured contact region are filled with the contact layer.

17. The subassembly component of claim 14, wherein the structured contact layer is one of a solder and a conductive adhesive.

18. The subassembly of claim 14, wherein interstices between the at least one terminal region of the semiconductor device and the structured contact region are filled with the contact layer.

19. The subassembly of claim 17, wherein the structured contact layer is applied on the at least one terminal region of the semiconductor component in parallel partial areas beneath contact surfaces of the structured contact region.

* * * * *

UNITED STATES PATENT AND TRADEMARK OFFICE
CERTIFICATE OF CORRECTION

PATENT NO.         : 7,573,727 B2                                      Page 1 of 1
APPLICATION NO.    : 10/514104
DATED              : August 11, 2009
INVENTOR(S)        : Hauenstein et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 480 days.

Signed and Sealed this

Seventh Day of September, 2010

David J. Kappos
*Director of the United States Patent and Trademark Office*